(12) United States Patent
Ji et al.

(10) Patent No.: US 8,298,438 B2
(45) Date of Patent: Oct. 30, 2012

(54) ACID CORROSION SOLUTION FOR PREPARING POLYSILICON SUEDE AND THE APPLIED METHOD OF IT

(75) Inventors: Jingjia Ji, Wuxi (CN); Yusen Qin, Wuxi (CN); Zhengrong Shi, Wuxi (CN)

(73) Assignee: Wuxi Suntech Power Co., Ltd., Jiangsu (CN)

( * ) Notice: Subject to any disclaimer, the term of this patent is extended or adjusted under 35 U.S.C. 154(b) by 917 days.

(21) Appl. No.: 12/225,382

(22) PCT Filed: May 24, 2006

(86) PCT No.: PCT/CN2006/001078
§ 371 (c)(1),
(2), (4) Date: Feb. 27, 2009

(87) PCT Pub. No.: WO2007/107053
PCT Pub. Date: Sep. 27, 2007

(65) Prior Publication Data
US 2010/0224593 A1    Sep. 9, 2010

(30) Foreign Application Priority Data

Mar. 21, 2006 (CN) .......................... 2006 1 0065676

(51) Int. Cl.
*C09K 13/08* (2006.01)
(52) U.S. Cl. ...................................................... 252/79.3
(58) Field of Classification Search ................. 252/79.3
See application file for complete search history.

(56) References Cited

FOREIGN PATENT DOCUMENTS

| | | | |
|---|---|---|---|
| CN | 1 614 789 | | 5/2005 |
| DE | 240552 | A * | 11/1986 |
| GB | 2 373 367 | | 9/2002 |
| GB | 2373367 | A * | 9/2002 |

OTHER PUBLICATIONS

International Search Report for PCT/CN2006/001078 mailed Dec. 21, 2006.

* cited by examiner

*Primary Examiner* — Roberts Culbert
(74) *Attorney, Agent, or Firm* — Nixon & Vanderhye P.C.

(57) ABSTRACT

An acid corrosion solution for preparing polysilicon suede is obtained by mixing with an oxidant and a hydrogen fluoride. The oxidant is a nitrate or nitrite. The method applied of the solution includes putting the polysilicon cut pieces into the acid corrosion solution to carry out the corrosion reaction. The reaction time is about 30 seconds to 20 minutes and the temperature of acid corrosion solution is −10° C. to 25° C.

7 Claims, 2 Drawing Sheets

ACID CORROSION SOLUTION FOR PREPARING POLYSILICON SUEDE AND THE APPLIED METHOD OF IT

This application is the U.S. national phase of International Application No. PCT/CN2006/001078 filed 24 May 2006 which designated the U.S. and claims priority to Chinese Patent Application No. 200610065676.4 filed 21 Mar. 2006, the entire contents of each of which are hereby incorporated by reference.

FIELD OF THE INVENTION

The present invention relates to an acid corrosion solution for preparing polysilicon suede (texture) for solar cell and a method for preparing polysilicon texture for solar cell using the acid corrosion solution.

BACKGROUND OF THE INVENTION

The Chinese patent application with the application No. 200410064831.1 disclosed a method for preparing polysilicon texture, wherein the initial surface morphology of the polysilicon could be maintained by using acid corrosion solution instead of conventional NaOH and KOH corrosion solutions meanwhile the damage layer on the polysilicon surface produced during the cutting process was removed. Therefore, the required texture could be obtained on the polysilicon surface after removing the damage layer. Although this method can satisfy the requirement for mass-preparation of the polysilicon texture, its disadvantages are obvious such as high cost for dealing with the waste acid produced during the process, especially the severe pollution of the heavy metal in waste acid to the environment, since the oxidant in acid corrosion solution is $CrO_3$, $K_2Cr_2O_7$ or the mixture thereof.

SUMMARY OF INVENTION

It is therefore an aspect of the present invention is to provide an acid corrosion solution with the advantages of lower cost of dealing with the waste acid produced during the process and avoid the pollution of the heavy metal. Another aspect of the present invention is to provide a method for preparing the polysilicon texture by using the acid corrosion solution.

That is, the present invention provides an acid corrosion solution for preparing the polysilicon texture by mixing oxidant and hydrofluoric acid solution, wherein the oxidant is nitrate or nitrite.

Preferably, the nitrate is sodium nitrate, potassium nitrate or ammonium nitrate, the nitrite is sodium nitrite, potassium nitrite or ammonium nitrite.

Preferably, the oxidant has a concentration of 0.1 to 10 mol/L and the hydrofluoric acid solution has a concentration of 10 to 25 mol/L.

Preferably, the oxidant has a concentration of 0.3 to 5 mol/L and the hydrofluoric acid solution has a concentration of 15 to 22 mol/L.

A method for preparing the polysilicon texture by using the acid corrosion solution specially includes immerging the chipping polysilicon into the acid corrosion solution to perform the corrosion reaction for 30 sec to 20 min, the temperature of the acid corrosion solution is −10° C. to 25° C.

Preferably, the reaction temperature is 0° C. to 15° C.

Preferably, the reaction time is 1 min to 10 min.

During the process of producing polysilicon texture by using the acid corrosion solution, the waste acid produced can be disposed via common neutralization reaction and the pollution of the heavy metal in the waste liquid can be avoided. The method for preparing the polysilicon texture by using the acid corrosion solution in the present invention is suitable for both intermittent and continuous mass processes.

DETAIL DESCRIPTION OF THE INVENTION

Example 1

Figure 1:
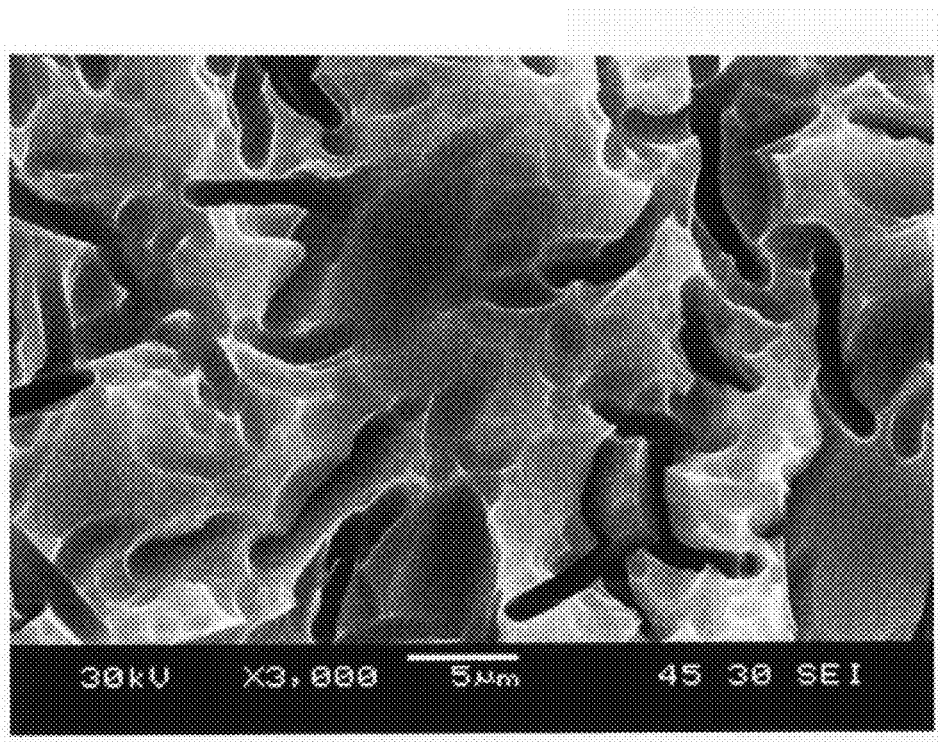
FIG. 1 is SEM photograph of the corroded polysilicon texture in Example 1.

5 mol KNO3 is added into hydrofluoric acid solution having a concentration of 20 mol/L and uniformly mixed and maintained at 20° C., after that the polysilicon sheet with 125*125 chipped by Linear-Cut is immerged in the solution and corroded for 10 min. Then the obtained polysilicon sheet is made into a solar cell. The solar cell has a conversion efficiency of 14.49%, fill factor of 0.765, open-circuit voltage of 598 mV and short-circuit current of 4.95 A. The surface morphology of the corroded polysilicon is illuminated in FIG. 1.

Example 2

Figure 2:
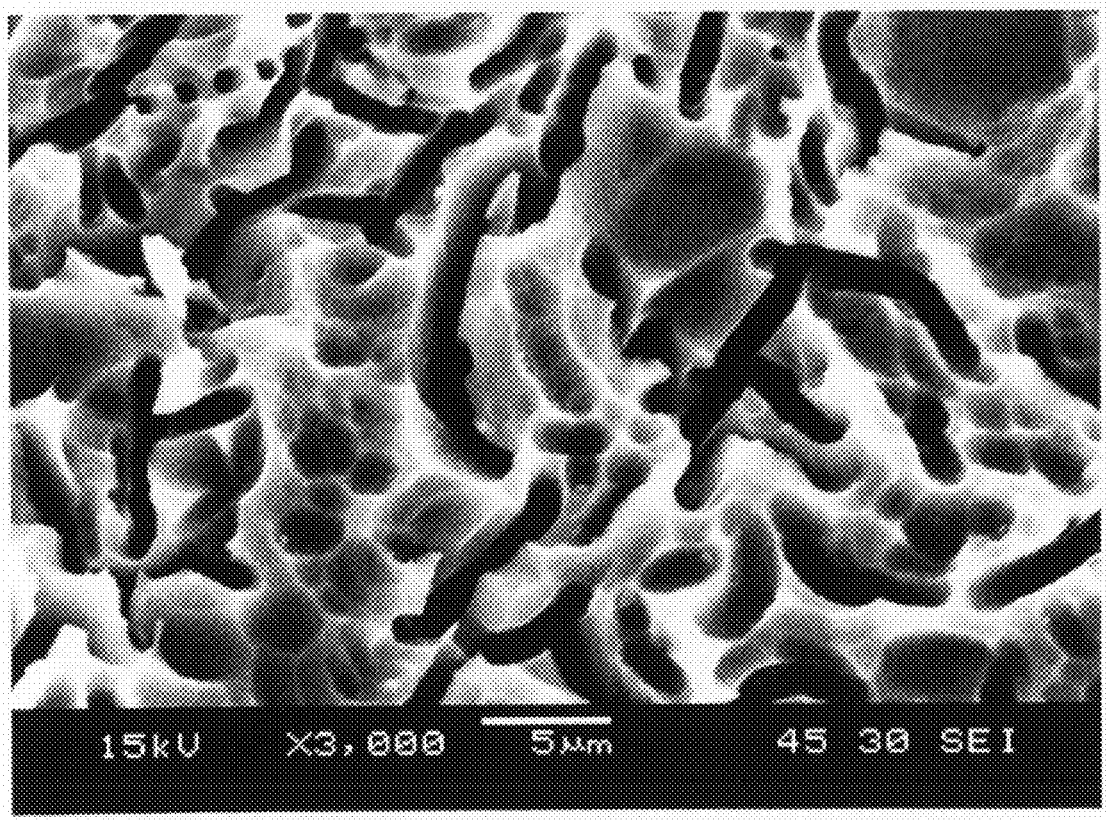
FIG. 2 is SEM photograph of the corroded polysilicon texture in Example 2.

2.34 mol NH4NO2 is added into 1 L hydrofluoric acid solution having a concentration of 20 mol/L and uniformly mixed and maintained at −10° C., after that the polysilicon sheet with 125*125 is immerged in the solution and corroded for 20 min. Then the obtained polysilicon sheet is made into a solar cell. The solar cell has a conversion efficiency of 15.38%, fill factor of 0.768, open-circuit voltage of 611 mV and short-circuit current of 5.12 A. The surface morphology of the corroded polysilicon is illuminated in FIG. 2.

Example 3

Figure 3:
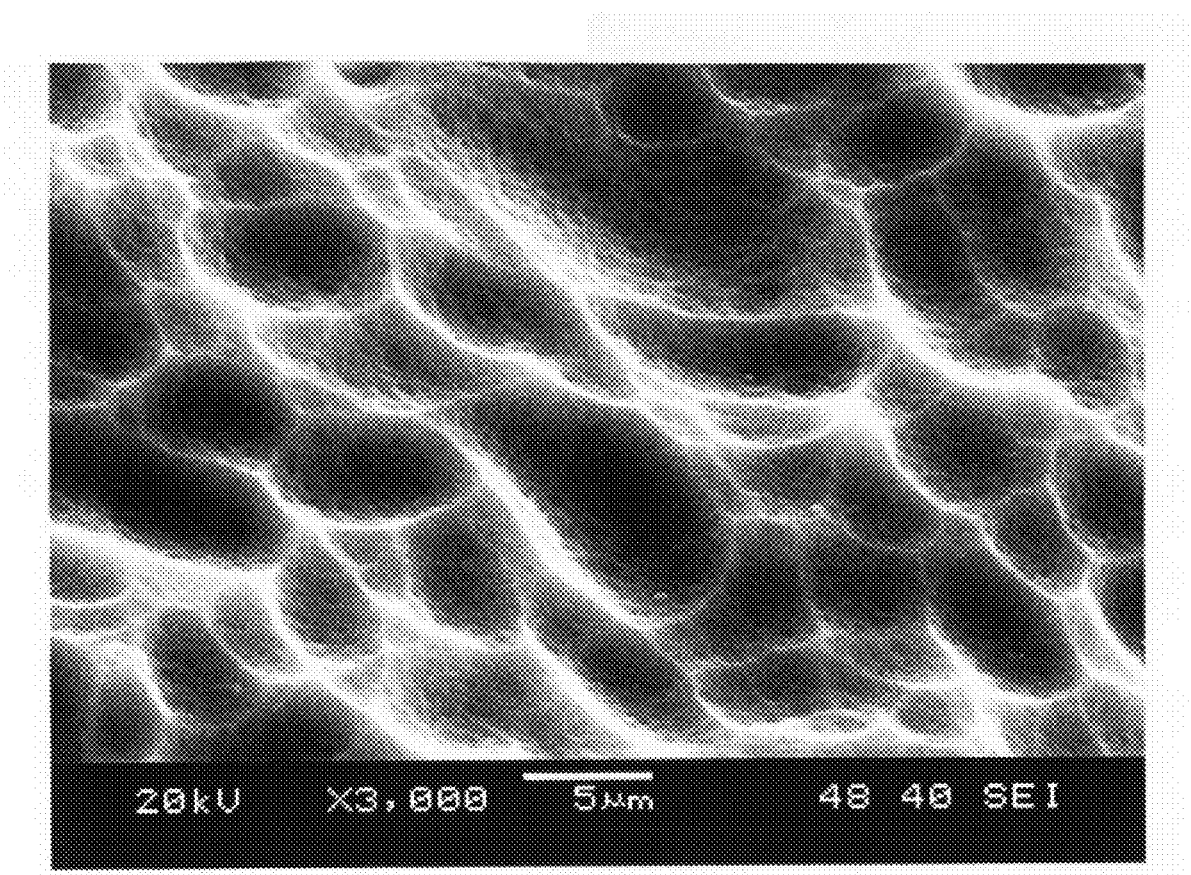
FIG. 3 is SEM photograph of the corroded polysilicon texture in Example 3.

1.17 mol NaNO3 is added into 1 L hydrofluoric acid solution having a concentration of 20 mol/L and uniformly mixed and maintained at 10° C., and then adding 0.15 mol NaNO2, after that the polysilicon sheet with 125*125 is immerged in the solution and corroded for 20 min. Then the obtained polysilicon sheet is made into a solar cell. The solar cell has a conversion efficiency of 15.03%, fill factor of 0.771, open-circuit voltage of 608 mV and short-circuit current of 5.01 A. The surface morphology of the corroded polysilicon is illuminated in FIG. 3.

The concentrations of oxidant and hydrofluoric acid of the acid corrosion solution in the present invention, the temperature of the solution and corrosion time during the preparing process of the polysilicon texture are not merely limited to the scope disclosed in the above examples. The parameters such as concentration, temperature, time etc. can be properly adjusted according to the present invention and the requirement for the performance of the polysilicon. For example, the corrosion time can be prolonged or shortened and the corrosion temperature can be increased or decreased according to the concentrations of the hydrofluoric acid solution and oxidant, in order to obtain the polysilicon having the required texture.

As for the concentrations of the oxidant and hydrofluoric acid, the solution temperature and corrosion time, the concentration of hydrofluoric acid is 10 to 25 mol/L, especially 15 to 22 mol/L, the concentration of oxidant is 0.1 to 10 mol/L, especially 0.3 to 5 mol/L, the temperature of the solution is −10° C. to 25° C., especially 0° C. to 15° C., corrosion time is 30 sec to 20 min, especially 1 min to 10 min. Under these conditions, the required corrosion efficiency and satisfied production efficiency can be achieved.

What is claimed is:

1. An acid corrosion solution for preparing polysilicon texture, comprising the mixed oxidant and hydrofluoric acid solution, wherein the oxidant is nitrate or nitrite, wherein the oxidant has a concentration of 0.1 to 10 mol/L and the hydrofluoric acid solution has a concentration of 10 to 25 mol/L.

2. The acid corrosion solution for preparing polysilicon texture according to claim 1, wherein the nitrate is sodium nitrate, potassium nitrate or ammonium nitrate, the nitrite is sodium nitrite, potassium nitrite or ammonium nitrite.

3. The acid corrosion solution for preparing polysilicon texture according to claim 1, wherein the oxidant has a concentration of 0.3 to 5 mol/L and the hydrofluoric acid solution has a concentration of 15 to 22 mol/L.

4. The acid corrosion solution for preparing polysilicon texture according to claim 1, wherein a purpose of the nitrate or nitrite is to form a homogeneous silica layer.

5. A method for preparing polysilicon texture using the acid corrosion solution of claim 1 comprising:
   adjusting the temperature of the acid corrosion solution to from about 31 10° C. to 25° C.; and
   immerging the chipping polysilicon into the acid corrosion solution to perform the corrosion reaction for 30 sec to 20 min., 6. The method for preparing polysilicon texture according to 5, wherein the reaction temperature is 0° C. to 15° C.

7. The method for preparing polysilicon texture according to claim 5, wherein the reaction time is 1 min to 10 min.

* * * * *